United States Patent
Choi

[19]

[11] Patent Number: 6,072,734
[45] Date of Patent: Jun. 6, 2000

[54] READ ONLY MEMORY HAVING BIAS CIRCUITS

[75] Inventor: Byeng-Sun Choi, Suwon, Rep. of Korea

[73] Assignee: Samsung Electronics, Co., Ltd., Suwon, Rep. of Korea

[21] Appl. No.: 09/389,648

[22] Filed: Sep. 2, 1999

[30] Foreign Application Priority Data

Sep. 2, 1998 [KR] Rep. of Korea ................ 98-36101

[51] Int. Cl.[7] .................................................. G11C 17/00
[52] U.S. Cl. ......................... 365/194; 365/104; 365/203
[58] Field of Search ........................... 365/104, 203, 365/194, 233.5; 327/261, 276

[56] References Cited

U.S. PATENT DOCUMENTS

| | | | |
|---|---|---|---|
| 5,241,497 | 8/1993 | Komarek | 365/104 |
| 5,566,129 | 10/1996 | Nakashima et al. | 365/233.5 |
| 5,600,586 | 2/1997 | Lee | 365/104 |
| 5,625,586 | 4/1997 | Yamasaki et al. | 365/104 |
| 5,757,709 | 5/1998 | Suminaga et al. | 365/104 |
| 5,790,450 | 8/1998 | Nishizaka et al. | 365/104 |

OTHER PUBLICATIONS

Mikiro Okada et al., "16Mb ROM Design Using Bank Select Architecture", Integrated Circuits Group, Sharp Corporation, Japan, pp. 85–86.

*Primary Examiner*—Son Mai
*Attorney, Agent, or Firm*—Marger Johnson & McCollom, P.C.

[57] ABSTRACT

The disclosure is a read only memory having a memory cell array formed of a plurality of memory cells coupled to wordlines and bitlines, the bitlines being alternately connected to main bitlines and ground lines. The invented read only memory include an address transition detection signal source. It also includes a first delay circuit for receiving the address transition detection signal and for generating a first discharge signal for driving the ground lines. It also includes a second delay circuit for receiving the address transition detection signal and for generating a second discharge signal for driving the main bitlines. It also includes a first pulse circuit for receiving the first discharge signal and for generating a first precharge signal for driving the ground lines. Finally, it includes a second pulse circuit for receiving the second discharge signal and for generating a second precharge signal for driving the main bitlines. The timing of the delay and pulse circuits are such that the trailing edges of the first and second discharge signals are substantially simultaneous with one another and that the leading edges of the first and second precharge signals are substantially simultaneous with one another. The result is that the voltage levels on a selected main bitlines and a non-selected ground line are substantially identical, permitting the memory to be read reliably.

6 Claims, 5 Drawing Sheets

READ ONLY MEMORY HAVING BIAS CIRCUITS

FIELD OF THE INVENTION

The present invention is in the field of semiconductor memory devices and is more specifically related to read only memories having a plurality of mask-programmed memory cells.

BACKGROUND OF THE INVENTION

Read only memories, generally referred to as nonvolatile memories, have merits of lower power consumption. A read only memory having flat-type memory cells has been proposed in 1988 Symposium on VLSI Circuits, pp.85–86, entitled 16 *Mb ROM Design Using Bank Select Architecture*, in which data stored in memory cells are read out through an hierarchical bitline structure under the way of bank selection.

FIG. 1 shows a general configuration of memory cell array like that of the article, being coupled with bias circuits. Memory cell array 10 is constructed of a plurality of flat-type memory cells, such as M11, M12, M13, M14 arranged in a NOR logic. The memory cells are connected to main bit lines MBL0–MBL2 through string (or bank) selection transistors ST0–ST4, each of the main bit lines being coupled to a pair of the string selection transistors. The memory cells also are connected to ground lines GBL0–GBL2 through ground selection transistors GT0–GT5, each of the ground lines being coupled to a pair of the ground selection transistors. Gates of the string and ground selection transistors are coupled, respectively, to string selection lines SSL0 and SSL1 and to ground section lines GSL0 and L1. The ground lines and main bit lines are coupled to bias circuits 20 and 30, respectively. Bias circuit 20 receives precharge signal PPRE1 and discharge signal PDIS1 while bias circuit 30 receives precharge signal PPRE2 and discharge signal PDIS2.

In operation, before a sensing cycle for reading, all of the main bit lines including a selected one are discharged and then only a selected main bit line is precharged at a predetermined voltage level in response to PPRE2. Assuming that memory cell M11 is selected for reading, SSL0, GSL0, and wordline WL0 are charged to high levels while all other wordlines and selection lines are held in low levels. Main bitline MBL0 connected to M11 through string selection transistor ST0 is charged to a predetermined voltage level in response to PPRE2. Other main bitlines not selected are held at 0V or in a floating state. The selected ground line GBL0 is set at 0V and other ground lines not selected are held at 0V or in a floating state.

If the selected memory cell M11 has been programmed as an on-cell, a sensing current passes through the channel of M11 and thereby a voltage level on MBL0 is detected by a sense amplifier as a low level. But if the M11 has been programmed as an off-cell, MBL0 maintains the precharged level. However, if adjacent memory cells, e.g., M12, M13, and M14, are all on-cells while M11 is an off-cell, leakage current path A is formed through the adjacent cells to GBL1, causing a failure in reading the selected off-cell M11.

Therefore, there seems a way to obviate such a problem in reading an off-cell. A precharge voltage might be applied to those non-selected main bitlines and ground lines that are adjacent to the selected main bit line and ground line, as well as to the selected main bitline and ground line. As shown in FIG. 2, discharge signals PDIS1 and PDIS2 would be activated in response to ATD (address transition detection) signal SUM, and then precharge signals PPRE1 and PPRE2 would be activated in response to the falling edges of PDIS1 and PDIS2, respectively. But assume that PDIS1 is active later than PDIS2 by time B, due to a difference of propagation skew between PDIS1 and PDIS2 in the device. Then PPRE1 is activated later than PPRE2 by time C. Since a selected main bitline is precharged earlier than a non-selected ground line, there is a capacitive coupling phenomenon between the selected main bitline and non-selected ground line (e.g., MBL0 and GBL1). As a result, the voltage level on the selected main bitline may be over the predetermined precharge voltage level by a level T. This excessive precharge voltage may cause a failure to read the selected memory cell.

SUMMARY OF THE INVENTION

The present invention is intended to solve the problems. And, it is an object of the invention to provide a read only memory free from a failure of reading memory cells.

It is another object of the invention to provide a read only memory providing an optimized biasing condition for a read operation.

In order to accomplish those objects, a read only memory of this invention includes a memory cell array formed of a plurality of memory cells coupled to wordlines and bitlines, the bitlines being alternately connected to main bitlines and ground lines, an address transition detection signal source, a first delay circuit for receiving the address transition detection signal and for generating a first discharge signal which is applied to the ground lines, a second delay circuit for receiving the address transition detection signal and for generating a second discharge signal which is applied to the main bitlines, a first pulse circuit for receiving the first discharge signal and for generating a first precharge signal which is applied to the ground lines, and a second pulse circuit for receiving the second discharge signal and for generating a second precharge signal which is applied to the main bitlines.

Specifically, the first delay circuit comprises a delay logic for driving the first discharge signal, to be activated at substantially the same time of that of the second discharge signal. The precharge signals are substantially identical in activation time and in voltage level. The first precharge signal is applied at least to a non-selected ground line which is adjacent to a selected ground line. The second precharge signal is applied to a selected main bitline corresponding to the selected ground line. Alternatively, the second delay circuit is comprised of a delay logic for driving the second discharge signal to be activated at substantially the same time as the first discharge signal, and the precharge signals are substantially identical in activation time and in voltage level. Thus, the first precharge signal is applied at least to a non-selected ground line which is adjacent to a selected ground line, and the second precharge signal is applied to a selected main bitline corresponding to the selected ground line.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the figures, like reference numerals denote like or corresponding parts.

DETAILED DESCRIPTION OF PREFERRED EMBODIMENT

Figure 3:
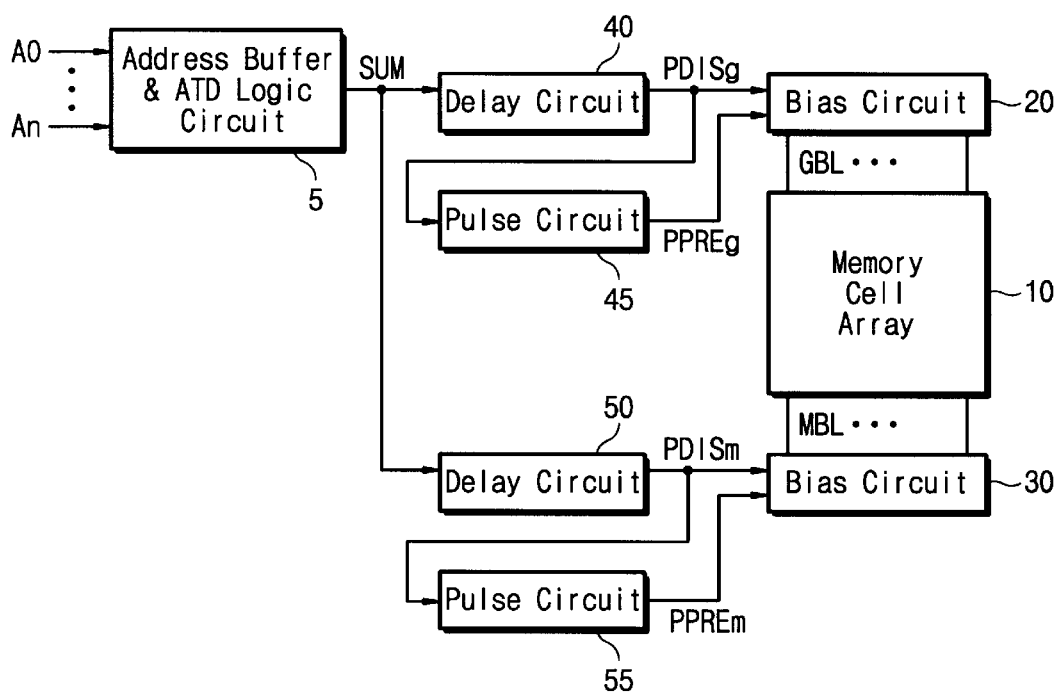
FIG. 3 is a functional block diagram of an advanced read only memory according to the invention.

Referring to FIG. 3, a read only memory device of the invention has delay circuits 40 and 50 for generating discharge signals PDISg and PDISm, respectively. PDISg is applied to bias circuit 20 coupled to ground lines GBL of a memory cell array 10, and PDISm is applied to bias circuit 30 coupled to main bitlines MBL of the memory cell array 10. Pulse delay circuits 40 and 50 receive ATD signal SUM which is supplied from address buffer & ATD logic circuit 5 (having address inputs Ao–An). PDISg is also applied to a pulse circuit 45 which generates precharge signal PPREg to be applied to bias circuit 20. PDISm is also applied to a pulse circuit 55 which generates precharge signal PPREm to be applied to bias circuit 30.

Figure 4A:
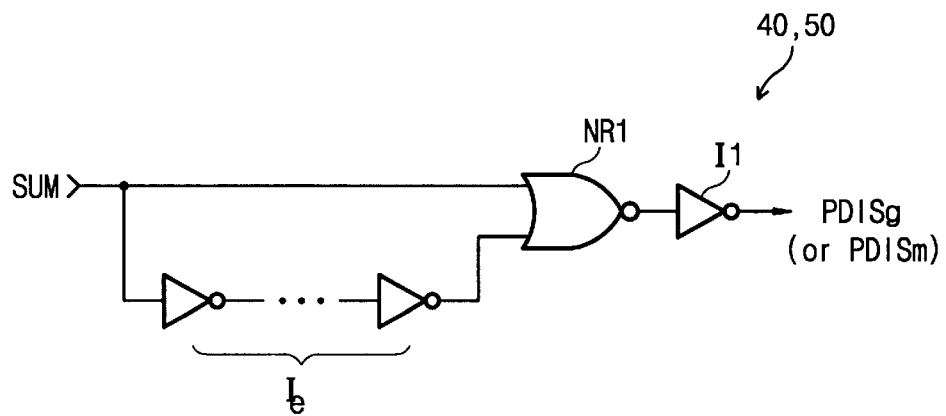
FIGS. 4A and 4B show exemplary delay and pulse control circuits forming a part of the read only memory of FIG. 3.

FIG. 4A illustrates construction of delay circuits 40, 50. Delay circuits 40, 50 include a NOR gate NR1 the inputs of which are SUM and a delayed version thereof. SUM is delayed via an even numbered plurality of inverters Ie. An inverter I1 inverts the output of NR1. The number of inverters Ie of delay circuit 40 can be different from that of delay circuit 50, because of different propagation skew as among inverters Ie. Preferably, the difference in timing (skew) between discharge signals PDISg and PDISm is minimized and most preferably eliminated by adjusting the number of inverters Ie.

Figure 5:
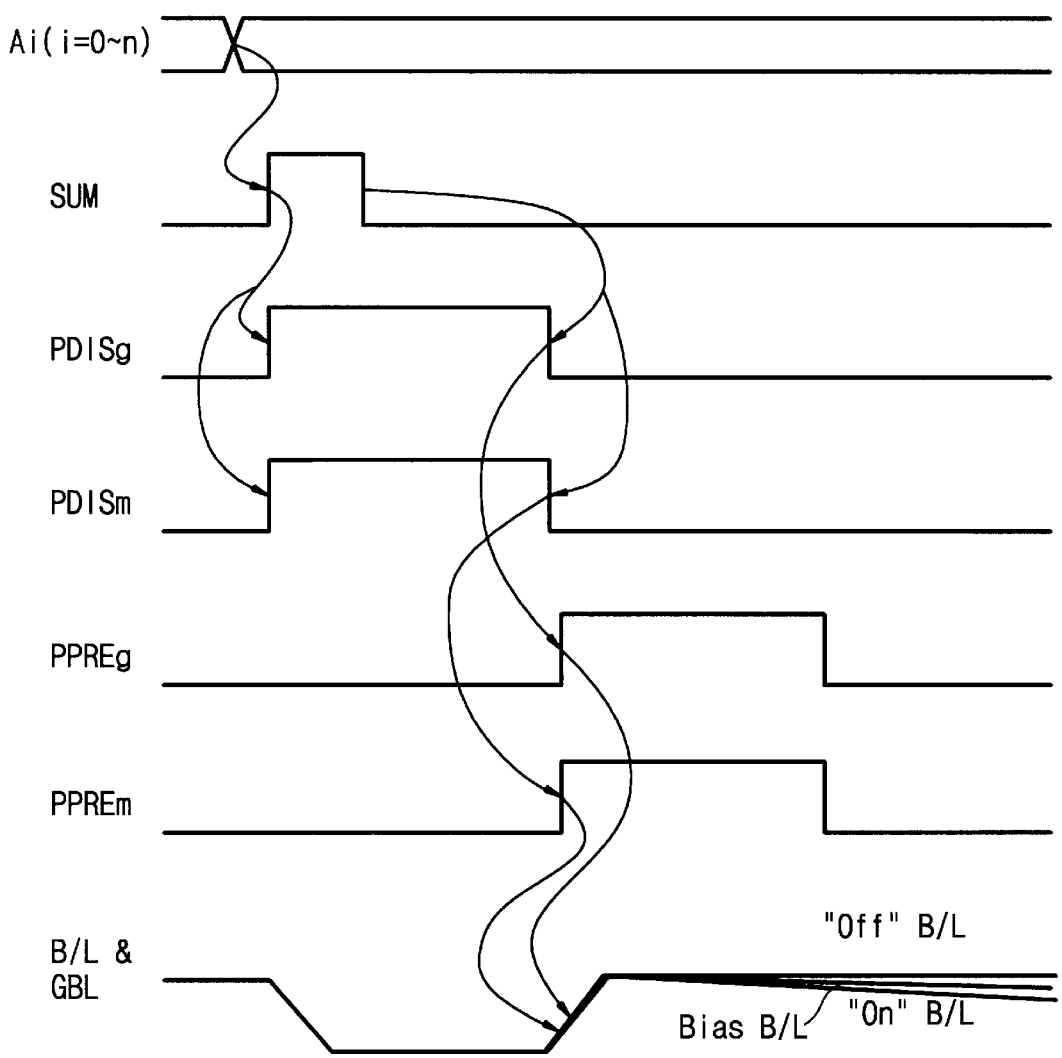
FIG. 5 is a timing diagram showing waveforms of discharge and precharge signals used in a read only memory device in accordance with the invention.

As mentioned in connection with FIG. 2, since PDIS1 (corresponding to PDISg) is later than PDIS2 (corresponding to PDISm), it is possible to match activation times of PDIS1 and PDIS2, as shown in FIG. 5. This is accomplished by making the number of the inverters Ie of delay circuit 50 be larger than that of delay circuit 40, or, conversely, by making the number of the inverters Ie of delay circuit 40 be smaller than that of delay circuit 50. Otherwise, the propagation skew between the discharge signals (PDIS1 and PDIS2) can be overcame by activating PDISm earlier than PDISg, considering the difference of activation time due to a physical phenomenon (such a difference of lengths of transfer lines) in the device.

Figure 4B:
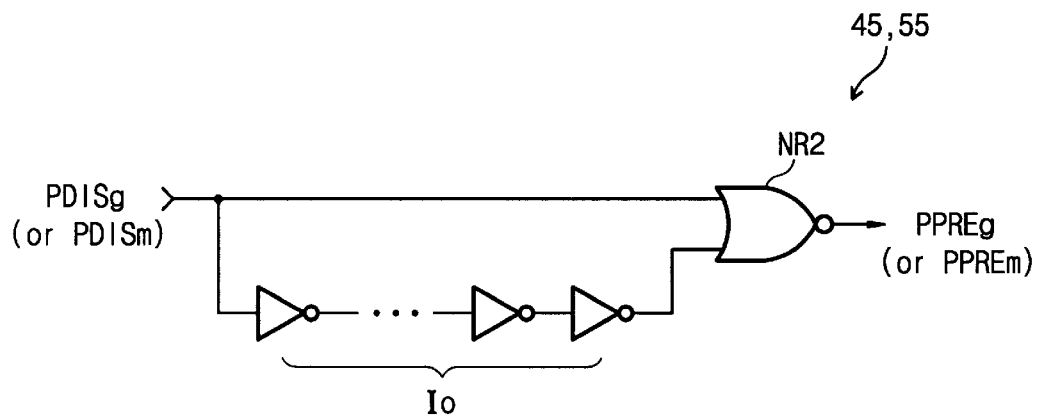

FIG. 4B illustrates construction of pulse circuit 45, 55. Pulse circuits 45, 55 generate a pulse of determined duration by delaying PDISg (or PDISm) via an odd number of inverters Io and NOR gate NR2. The number of inverters Io is determined by the desired pulse width of the precharge signal (PPREg or PPREm) shown in FIG. 5.

FIG. 5 shows the beneficial timing in accordance with the invention whereby discharge signals PDISg and PDISm are activated at the same time in response to ATD pulsed signal SUM, and thereby precharge signals PPREg and PPREm, each timed via delays to be subsequent to the corresponding discharge signals and synchronous with each other. The synchronous precharge signals thus are applied to non-selected ground lines (such as GBL1) and a selected main bitline, respectively, at substantially the same time.

Figure 1:
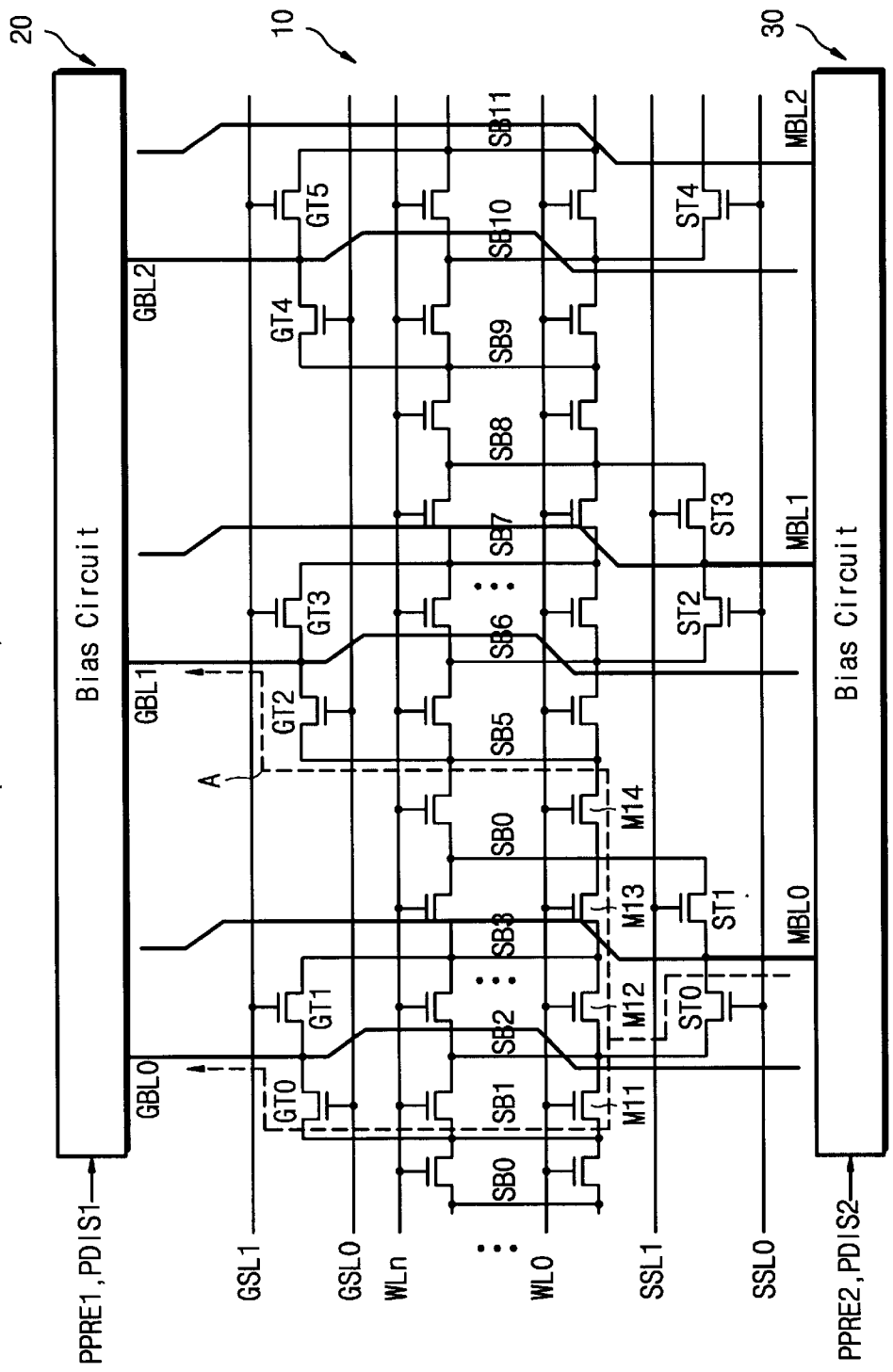
FIG. 1 is a schematic diagram of a memory cell array and bias circuits in a prior art read only memory device.
Figure 2:
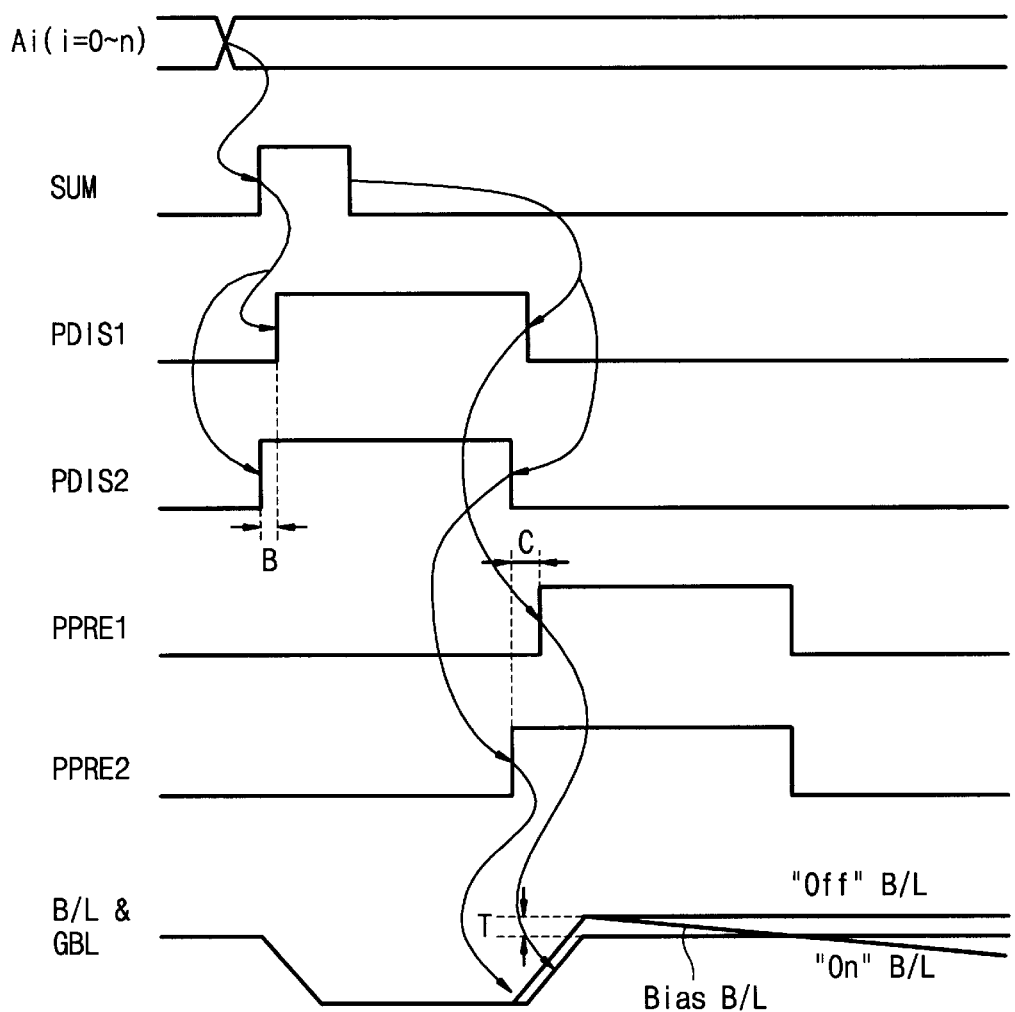
FIG. 2 is a timing diagram showing waveforms of discharge and precharge signals used in a prior art read only memory device.

As a result, there is no over-precharging (as by an overvoltage T shown in FIG. 2 illustrating the prior art) on a selected main bitline. This is because, in accordance with the invention, voltage levels on the selected main bitline (e.g., MBL0) and a non-selected ground line (e.g., GBL0) are equal, i.e. there is no potential difference between them. The invention thus prevents a failure to read the semiconductor read only memory device.

Although specific constructions and procedures of the invention have been illustrated and described herein, it is not intended that the invention be limited to the elements and constructions disclosed. One skilled in the art will easily recognize that the particular elements or sub-construction may be used without departing from the scope and spirit of the invention.

I claim:

1. A read only memory comprising:

a memory cell array formed of a plurality of memory cells coupled to wordlines and bitlines, the bitlines being alternately connected to main bitlines and ground lines;

an address transition detection signal source;

a first delay circuit for receiving the address transition detection signal and for generating a first discharge signal which is applied to the ground lines;

a second delay circuit for receiving the address transition detection signal and for generating a second discharge signal which is applied to the main bitlines;

a first pulse circuit for receiving the first discharge signal and for generating a first precharge signal which is applied to the ground lines; and a second pulse circuit for receiving the second discharge signal and for generating a second precharge signal which is applied to the main bitlines.

2. A read only memory as defined in claim 1 in which the first delay circuit includes a delay logic for driving the first discharge signal to be activated at substantially the same time of that of the second discharge signal.

3. A read only memory as defined in claim 2 in which the precharge signals are substantially identical in an activation time and in voltage level, the first precharge signal being applied at least to a non-selected ground line which is adjacent to a selected ground line, the second precharge signal being applied to a selected main bitline corresponding to the selected ground line.

4. A read only memory as defined in claim 1 in which the second delay circuit includes a delay logic for driving the second discharge signal to be activated at substantially the same time of that of the first discharge signal.

5. A read only memory as defined in claim 4 in which the precharge signals are substantially identical in an activation time and in voltage level, the first precharge signal being applied at least to a non-selected ground line which is adjacent to a selected ground line, the second precharge signal being applied to a selected main bitline corresponding to the selected ground line.

6. Delay logic for use in a read only memory having a plurality of memory cells coupled to wordlines and bitlines, the bitlines being alternately connected to main bitlines and ground lines, the delay logic comprising:

first and second delay circuits each for receiving an address transition detection signal from the memory, the first and second delay circuits producing first and second discharge signals for driving the ground lines and the main bitlines, respectively, of the memory, the first and second discharge signals having trailing edges that are substantially simultaneous with one another, the first and second discharge signals representing differentially time-delayed versions of the address transition detection signal; and first and second pulse circuits receiving the first and second discharge signals and producing first and second precharge signals the leading edges of which follow the trailing edges of the first and second discharge signals, wherein the first and second precharge signals are for driving the ground lines and the main bitlines, respectively, of the memory, the first and second precharge signals having leading edges that are substantially simultaneous with one another.

* * * * *